(12) United States Patent
Moriguchi et al.

(10) Patent No.: US 7,042,215 B2
(45) Date of Patent: *May 9, 2006

(54) THREE POINT DIXON TECHNIQUES IN MRI SPIRAL TRAJECTORIES WITH OFF-RESONANCE CORRECTION WHERE EACH TE IS A MULTIPLE OF 2.2 MILLISECONDS

(75) Inventors: Hisamoto Moriguchi, Cleveland, OH (US); Jonathan S. Lewin, Baltimore, MD (US); Jeffrey L. Duerk, Avon Lake, OH (US)

(73) Assignee: Case Western Reserve University, Cleveland, OH (US)

( * ) Notice: Subject to any disclaimer, the term of this patent is extended or adjusted under 35 U.S.C. 154(b) by 44 days.

This patent is subject to a terminal disclaimer.

(21) Appl. No.: 10/832,659

(22) Filed: Apr. 26, 2004

(65) Prior Publication Data

US 2005/0033153 A1    Feb. 10, 2005

Related U.S. Application Data

(60) Provisional application No. 60/465,551, filed on Apr. 25, 2003.

(51) Int. Cl.
    *G01V 3/00*    (2006.01)
(52) U.S. Cl. .................. 324/307; 324/309
(58) Field of Classification Search .......... 324/303, 324/307, 309, 312; 600/410
    See application file for complete search history.

(56) References Cited

U.S. PATENT DOCUMENTS

| | | | |
|---|---|---|---|
| 4,746,864 A | * | 5/1988 | Satoh ................... 324/309 |
| 5,270,653 A | * | 12/1993 | Pauly ................... 324/309 |
| 5,402,067 A | * | 3/1995 | Pauly et al. ............. 324/307 |
| 5,498,960 A | * | 3/1996 | Vinegar et al. .......... 324/303 |

(Continued)

FOREIGN PATENT DOCUMENTS

EP    0950902    10/1999

(Continued)

OTHER PUBLICATIONS

Kwok et al., article: "Interleaved Water and Fat Dual-Echo Spin Echo Imaging with Intrinsic Chemical-Shift Elimination", Journal of Magnetic Resonance Imaging 13: 318-323 (2001).*

(Continued)

*Primary Examiner*—Diego Gutierrez
*Assistant Examiner*—Tiffany A. Fetzner
(74) *Attorney, Agent, or Firm*—Hahn Loeser & Parks LLP

(57) ABSTRACT

Spiral imaging has recently gained acceptance for rapid MR data acquisition. One of the main disadvantages of spiral imaging, however, is blurring artifacts due to off-resonance effects. Dixon techniques have been developed as methods of water-fat signal decomposition in rectilinear sampling schemes, and they can produce unequivocal water-fat signal decomposition even in the presence of $B_0$ inhomogeneity. Three-point and two-point Dixon techniques can be extended to conventional spiral and variable-density spiral data acquisitions for unambiguous water-fat decomposition with off-resonance blurring correction. In the spiral three-point Dixon technique, water-fat signal decomposition and image deblurring are performed based on the frequency maps that are directly derived from the acquired images. In the spiral two-point Dixon technique, several predetermined frequencies are tested to create a frequency map. The techniques can achieve more effective and more uniform fat signal suppression when compared to the conventional spiral acquisition method with SPSP pulses.

15 Claims, 11 Drawing Sheets

U.S. PATENT DOCUMENTS

| | | | | |
|---|---|---|---|---|
| 5,539,313 | A * | 7/1996 | Meyer | 324/309 |
| 5,652,516 | A * | 7/1997 | Adalsteinsson et al. | 324/309 |
| 6,016,057 | A * | 1/2000 | Ma | 324/309 |
| 6,020,739 | A * | 2/2000 | Meyer et al. | 324/309 |
| 6,084,408 | A * | 7/2000 | Chen et al. | 324/303 |
| 6,215,306 | B1 * | 4/2001 | Tsai et al. | 324/309 |
| 6,459,922 | B1 * | 10/2002 | Zhang | 600/410 |
| 6,486,670 | B1 * | 11/2002 | Heid | 324/307 |
| 6,583,623 | B1 * | 6/2003 | Kwok et al. | 324/307 |
| 6,603,990 | B1 * | 8/2003 | Zhang et al. | 600/410 |
| 2001/0026157 | A1 * | 10/2001 | Heid | 324/312 |
| 2003/0060697 | A1 * | 3/2003 | Zhang et al. | 600/410 |
| 2005/0017717 | A1 * | 1/2005 | Duerk et al. | 324/307 |
| 2005/0033153 | A1 * | 2/2005 | Moriguchi et al. | 600/410 |

FOREIGN PATENT DOCUMENTS

| | | | |
|---|---|---|---|
| WO | WO 2004086060 | A2 * | 10/2004 |
| WO | WO 2004097387 | A2 * | 11/2004 |

OTHER PUBLICATIONS

Noll D. C. et al: "Deblurring for Non-2D Fourier Transform Magnetic Reasonance Imaging" 1-2,5,6, 8-20 (Magnetic Resonance in Medicine 25, (1992).

King K.F. et al., "Concomitant gradient field effects in spiral scans" (Magnetic Resonance in Medicine: (Official Journal of the Society of Magnetic Resonance in Medicine/Society of Magnetic Resonance in Medicine.) (Jan. 1999, vol. 41, No. 1, Jan. 1999 pp. 103-112).

Irarrazabal P. et al.: "Inhomogeneity Correction Using An Estimated Linear Field Map" (Magnetic Resonance in Medicine, Academic Press, Duluth, MN, US, vol. 35, No. 2, Feb. 1, 1996, pp. 278-282.

Nayak K. S. et al: "Efficient off-resonance correction for spiral imaging" (Magnetic Resonance in Medicine Wiley USA, vol. 45, No. 3, 2001, pp. 521-524).

Man L-C et al: Multifrequency Interpolation for Fast Off-Resonance Correction (Magnetic Resonance in Medicine, Academic Press, Duluth, MN, US, vol. 37, No. 5, May 1, 1997 pp. 785-792.

Glover, G. H. et. al.: "Three-Point Dixon Technique for True Water/Fat Decomposition with BO Inhomogeneity Correction" (Magnetic Resonance in Medicine, Academic Press, Duluth, MN, US, vol. 18, No. 2, Apr. 1, 1991 pp. 371-383.

* cited by examiner

THREE POINT DIXON TECHNIQUES IN MRI SPIRAL TRAJECTORIES WITH OFF-RESONANCE CORRECTION WHERE EACH TE IS A MULTIPLE OF 2.2 MILLISECONDS

CROSS REFERENCE TO PRIORITY APPLICATION

The U.S. patent application Ser. No. 10/832,659 of the instant invention was filed on Apr. 26, 2004, published on Feb. 10, 2005 as U.S. Pat. Application Publication 2005/033153 A1, and corresponds to International application number PCT/US2004/012858 with an International Publication number of WO 2004/097387 A2 published on Nov. 11, 2004. This U.S. application Ser. No. 10/832,659, its publication as US 2005/033153 A1, and the international publication of WO 2004/097387 A2 all claim(s) priority to the U.S. provisional application of 60/465,551 filed on Apr. 25, 2003 which is incorporated herein by reference in its entirety. These applications/publications have the same inventive entity as the current application and correspond to one another.

CROSS REFERENCE TO RELATED CO-PENDING APPLICATION/PUBLICATION

This application is related to earlier-filed copending U.S. patent application Ser. No. 10/805,841 filed on Mar. 22, 2004, and published on Jan. 27, 2005 as U.S. Patent Application Publication 2005/0017717 A1; which corresponds to International application Number. PCT/US2004/008636 with an International Publication number of WO 2004/086060 A2 published on Oct. 7, 2004. This related application and its associated US and international publications claim(s) priority to U.S. provisional Ser. No. 60/456,333 filed Mar. 20, 2003, which is incorporated herein by reference in its entirety.

REFERENCE TO RELATED APPLICATION

This application claims priority to provisional application Ser. No. 60/465,551 filed 25 Apr. 2003, the contents of which are hereby incorporated by reference.

BACKGROUND

Off-resonance effects (e.g., field inhomogeneity, susceptibility, chemical shift) cause artifacts in magnetic resonance imaging (MRI). The artifacts appear as positional shifts along the readout direction in rectilinearly sampled acquisitions. Usually, they are insignificant because of short readout times in normal spin-echo (SE) and gradient-echo (GRE) sequences. However, off-resonance artifacts sometimes appear as severe geometric distortion because of the relatively long readout time in echo planar imaging (EPI).

Over the past decade, spiral imaging techniques have gained in popularity due to their short scan time and insensitivity to flow artifacts. However, off-resonance effects cause blurring artifacts in the reconstructed image. Most spiral off-resonance correction methods proposed to date are difficult to apply to correct for blurring artifacts due to the fat signals, since the fat-water frequency shift is typically much greater than that due to main magnetic field ($B_0$) inhomogeneity across the field of view (FOV). As such, off-resonance artifacts remain one of the main disadvantages of spiral imaging.

Currently, off-resonance artifacts due to fat signals are most commonly avoided by use of spatially and spectrally selective radio-frequency (RF) excitation pulses (SPSP pulses) since they excite only water spins, thereby eliminating the off-resonance fat signals and thus avoiding artifact generation. Yet, SPSP pulses may not lead to satisfactory fat signal suppression in the presence of large $B_0$ inhomogeneity. Excitation of only water spins could be achieved through application of chemical shift presaturation pulses [e.g., CHESS pulses] prior to normal spatially selective excitation. However, the effectiveness of these frequency selective RF excitation pulses is dependent on main magnetic field homogeneity.

Alternatively, Dixon techniques have been investigated for water-fat decomposition in rectilinear sampling schemes. In the original Dixon technique, water and fat images were generated by either addition or subtraction of the "in-phase" and "out-of-phase" data sets. Water and fat separation is unequivocal using this technique when magnetic field inhomogeneity is negligible over the scanned object. However, when $B_0$ inhomogeneity cannot be neglected, the original Dixon technique fails to accurately decompose water and fat signals. Therefore, modified Dixon techniques using three data sets (i.e., three-point Dixon (3PD) technique) or four data sets were developed to correct for $B_0$ inhomogeneity off-resonance effects and microscopic susceptibility dephasing. New versions of the Dixon technique use two data sets with $B_0$ inhomogeneity off-resonance correction, i.e., the two-point Dixon (2PD) technique. The water-fat decomposition performance is almost equivalent to that of the 3PD technique, although off-resonance frequency estimation of this technique is unstable for voxels with nearly equal water and fat signal intensities. The advantage of these multiple-point Dixon techniques over spectrally excited RF pulses is that unequivocal water-fat separation can be achieved even in the presence of $B_0$ inhomogeneity. This advantage is of notable importance because neither tissue-induced local magnetic field inhomogeneity nor externally applied magnetic field inhomogeneity can be completely removed.

What is needed is an extension to the 3PD and 2PD techniques to spiral trajectories with effective water-fat decomposition with $B_0$ inhomogeneity off-resonance correction.

SUMMARY

Three-point and two-point Dixon techniques are extended to conventional spiral and variable-density spiral data acquisition trajectories to achieve unambiguous water-fat decomposition with $B_0$ inhomogeneity off-resonance blurring correction. In the spiral three-point Dixon technique, water-fat signal decomposition and image deblurring are performed based on the frequency maps that are derived from the acquired images. In the spiral two-point Dixon technique, several predetermined frequencies are tested to create a frequency map. The frequency map is then employed to deblur the images.

Furthermore, the multiple required acquisitions for the Dixon techniques are not a significant limitation in the present method. Compared to the conventional spiral data acquisitions, as the prior art spiral trajectories typically require two data sets with slightly different TE's to create a frequency map for off-resonance correction. The newly proposed techniques also do not require SPSP pulses to provide effective fat signal suppression and off-resonance blurring correction.

Thus, the systems and methods described herein achieve more effective and more uniform fat signal suppression than the conventional spiral acquisition method without the need to generate and process SPSP pulses.

More particularly, the systems and methods described herein provide, in one aspect, a method for constructing an image from an MRI data set, comprising employing a spiral trajectory to acquire the MRI data set; determining for respective pixels in an image being constructed, a frequency parameter representative of a measure of off-resonance signal for voxels associated with the respective pixel; processing as a function of the frequency parameter, the MRI data set to generate a first image and a second image; and deblurring at least one of said first and second images as a function of the frequency parameter. Optionally, the method may include acquiring the MRI data with two acquisition processes having a predefined timing relationship, which may be for example a time-delayed sequence having a time delay selected to filter water spins from fat spins, and wherein the time delay is selected to allow for fat spins to precess 180 degrees out of phase with respect to water spins.

Optionally, acquiring the data includes providing three acquisition patterns, and deblurring includes employing a frequency segmented off-resonance correction process to generate several candidate images. Applying an RF pulse having a predefined pattern may optionally include a time delay selected to be an integer multiple of a time period for allowing fat spins to precess 180 o out of phase with respect to water spins.

In a further optional practice, determining an off-resonance frequency for a pixel in an image may be achieved by comparing orientations of a vector representative of a first image with a vector representative of a second image.

Further optionally, the method may include acquiring MRI data from a plurality of RF receiver coils. MRI data from the multiple RF coils can be combined to generate a weighted sum average of signal intensity for a pixel in the image, and the method can minimize the angular relationship between two vectors for each data set generated from an RF coil.

Acquiring MRI data can include employing a variable-density spiral pattern having a plurality of spiral interleaves and the methods can be carried out on MRI machines capable of constructing an image from an MRI data set. Such machines can be MRI machines programmed to execute a series of instruction for performing the methods described herein, and in particular embodiments, may comprise a field controller for generating a field around a specimen, a data acquisition mechanism for employing a spiral trajectory to acquire the MRI data set, a processor for determining for respective pixels in an image being constructed, a frequency parameter representative of a measure of off-resonance signal for voxels associated with the respective pixels and for processing as a function of the frequency parameter, the MRI data set to generate a first image and a second image, and an image processor for deblurring at least one of said first and second images as a function of the frequency parameter.

BRIEF DESCRIPTION OF THE DRAWINGS

The present disclosure may be better understood and its numerous features and advantages are made apparent to those skilled in the art by referencing the accompanying drawings. The use of the same reference symbols in different drawings indicates similar or identical items.

DETAILED DESCRIPTION

Figure 1:
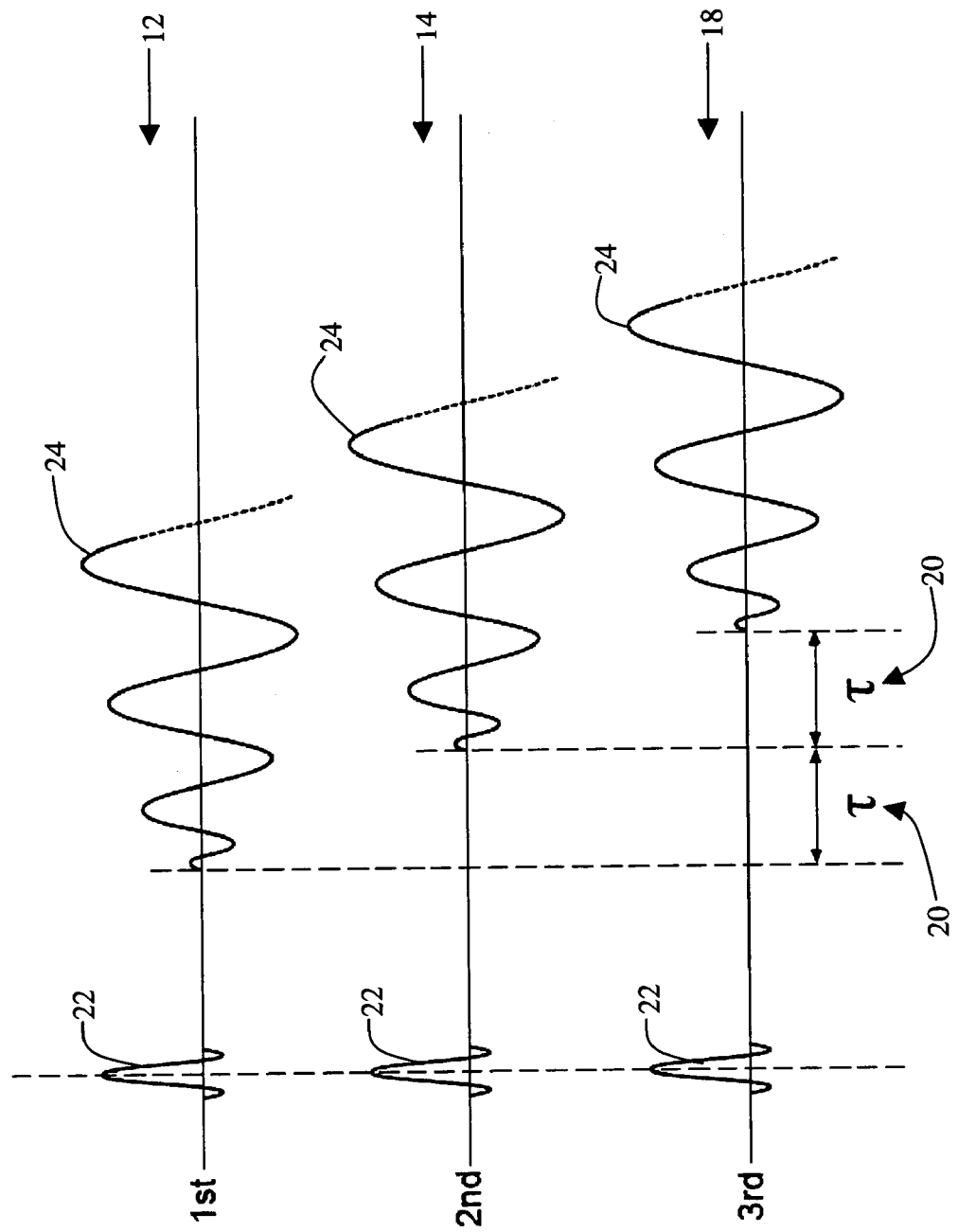
FIG. 1 is a simplified sequence diagram of the spiral three-point Dixon (spiral 3PD) technique.

The systems and methods described herein extend three-point and two-point Dixon techniques to spiral imaging techniques including variable-density spiral imaging techniques, and spiral imaging techniques that include a plurality of interleaves.

Spiral imaging is used for a variety of applications as it provides efficient k-space coverage and excellent flow properties. The systems and methods described herein extend Dixon methods to spiral imaging, to allow spiral imaging to be employed to collect MRI data, and Dixon techniques to be applied to the collected data for the purpose of resolving the collected data into two separate images, one typically associated with water, and the other typically associated with fat or lipid. The systems and methods described herein account for off-resonance frequency image degradation, and further provide both two point and three point Dixon methods that allow for spiral imaging with off-resonance frequency compensation. Accordingly, the systems and methods combine the benefits of spiral imaging with water/fat decomposition.

More specifically, the systems and methods described herein extend 3PD and 2PD to spiral trajectories for effective water-fat decomposition with $B_0$ inhomogeneity off-resonance correction. The multiple required acquisitions for the Dixon techniques are not a significant limitation in the described methods, compared to conventional spiral data acquisitions, as they often require two data sets with slightly different echo times TE's to create a frequency map for off-resonance correction. The techniques described herein do not require spatial-spectral pulses and provide effective fat signal suppression and off-resonance blurring correction.

The long readout time of spiral trajectories leads to off-resonance signals that blur into neighboring pixels; spins from multiple off-resonance frequencies can all contribute to a voxel signal. To address this, the disclosed systems and methods generally assume that $B_0$ inhomogeneity is smoothly varying across the FOV. This assumption will be referred to as 'assumption (i)' herein. Thus, the average off-resonance frequency in any pixel is typically or substantially close to the true local $B_0$ field strength. This concept is employed in the conventional method to create an off-resonance frequency map in spiral imaging, in which the phase difference is taken between two images, with different TE's, even though both images are blurred by off-resonance effects.

In the following description, in addition to the above assumption (i), it is also assumed that: only two chemical shift species, i.e. water and fat, are considered, and their spectra are both sufficiently narrow so that little spectral overlap occurs; and signal intensity differences due to T2* decay among data sets with different TE's are negligible, or substantially negligible. Although these assumptions are helpful and useful for the typical MRI application, it will be understood by those of skill in the art, that the systems and methods described herein are not so limited and may, in other applications, including MRI applications or other magnetic resonance signal detection applications, employ a different set of assumptions that extend to applications other than resolving images of water and fat.

In the first aspect, the invention provides methods for Spiral 3PD. To this end, the method acquires three k-space data sets with TE differences, $\Delta TE$ (s), using a normal spatially-selective RF pulse for each TR. Specifically, FIG. 1 depicts simplified sequence diagram of a spiral three-point Dixon process. In this process, the three data sets are acquired with different TE's. More particularly, FIG. 1 depicts three data sets, 12, 14 and 18 each of which is acquired using a spiral imaging technique. As will be described later, the spiral technique may have variable density, a plurality of interleaves, or have some other variation or modification. In any case, the data is collected to provide three data sets, each of which has a defined relationship in time relative to the other two data sets.

Specifically, a first data component 22 is acquired in response to an initial pulse of RF energy. After a delay time, a second data component 24 is acquired. As shown in FIG. 1, the second data set 14 has a similar initiation pulse 22, which is followed by a delay period which is extended by an additional time delay $\tau 20$. The third dataset, 18, includes the same initiation pulse 22 and a similar echo data component 24, but in this case the echo component 24 is followed by the original delay time and two delay periods $\tau 20$. Accordingly, the TE difference between the first and the second acquisitions and between the second and the third acquisitions are equal to $\tau 20$, the time during which fat spins precess but, 180° out of phase with respect to water spins.

As described in previously-proposed rectilinear 3PD techniques (Glover, et al., Three point Dixon technique for true water/fat decomposition with B0 inhomogenity correction, Magn. Res. Med. (1991)), if $\Delta TE$ is chosen as $\tau$, the time during which fat spins precess by 180° out of phase with respect to water spins, the signals at each pixel in the reconstructed images ($S_0$, $S_1$ and $S_2$) from these data sets can be expressed as:

$$S_0 = W' + F' \quad [1]$$

$$S_1 = (W' - F')\exp(i\phi) \quad [2]$$

$$S_2 = (W' + F')\exp(i2\phi) \quad [3]$$

where W' represent water signals blurred by local $B_0$ inhomogeneity off-resonance frequency f (Hz), F' are fat signals blurred by local $B_0$ inhomogeneity and chemical-shift off-resonance frequencies $f + f_{fat}$ (Hz), and $\phi$ is the phase shift due to $B_0$ inhomogeneity off-resonance effects during $\Delta TE$. That is, $$\phi = 2\pi f \cdot \Delta TE = 2\pi f \tau. \quad [4]$$

Figure 2:
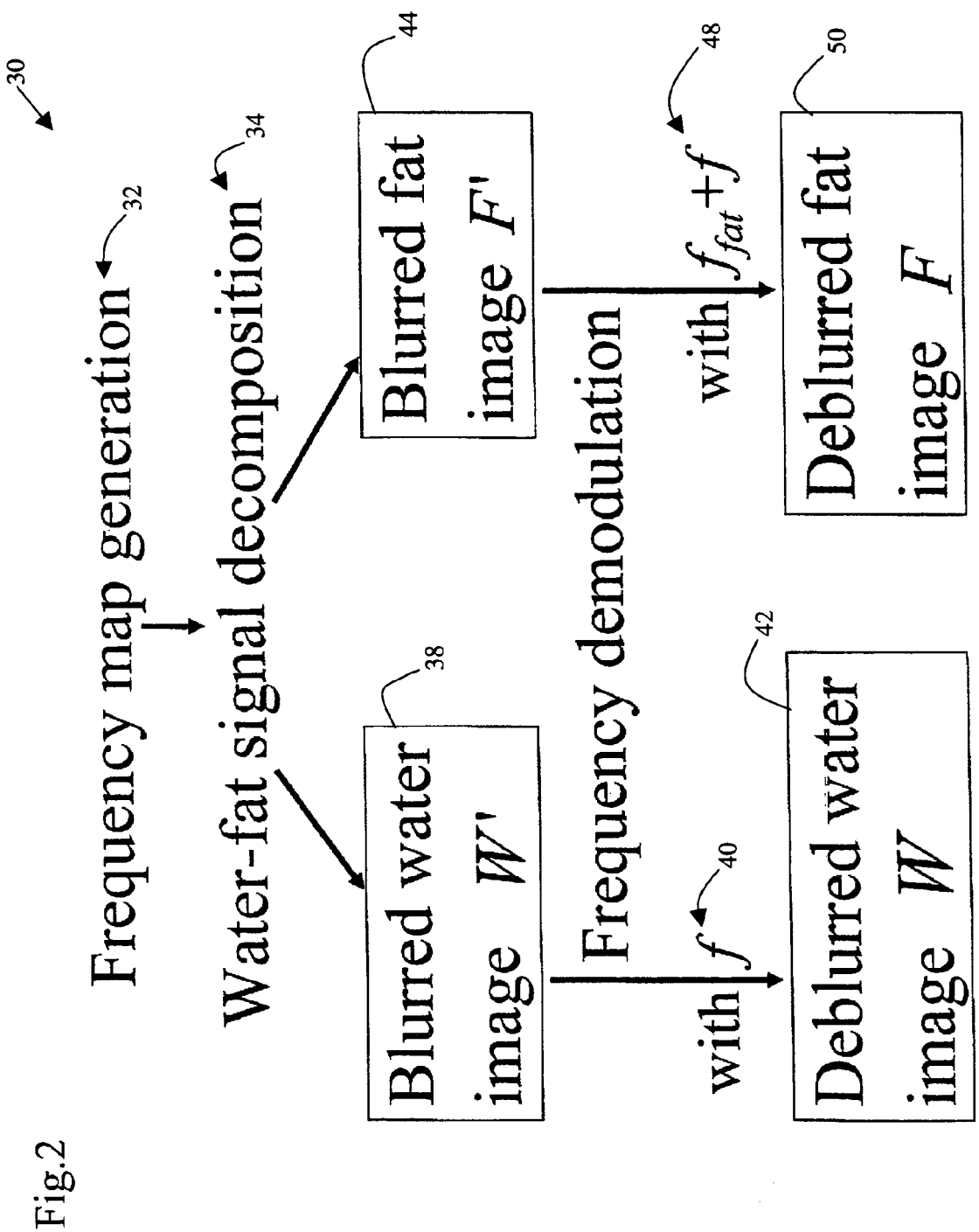
FIG. 2 is a flow chart of one practice of a spiral 3PD process.

FIG. 2 shows a flow chart of one practice of the spiral 3PD process. More particularly, FIG. 2 depicts a first process 30 that begins in step 32, where a frequency map begins to be generated to identify for each pixel, or subset of pixels, within the image or images being produced, a frequency signal to be used for compensating the intensity value of the associated pixel. In step 34, the process 30 begins a water-fat signal decomposition process. To that end, the process divides into two parallel operations wherein, in this application, one process generates a deblurred water image from the acquired data, and in the other process, a deblurred fat image is produced from the acquired data.

Starting with the process for deblurring the water image, the process 30 in step 34 preceeds to step 38, wherein the blurred water image is selected 38. In Step 40, a frequency demodulation process, as described in more detail below, is applied, wherein for an off-resonance frequency 'f', the image data collected in step 38 is demodulated to produce the deblurred water image of step 42. Similarly, in parallel step 44, the blurred fat image is collected from the acquired data and a frequency demodulation process is carried out in step 48, wherein, the off-resonance frequency for the fat image is employed during a frequency demodulation process that produces the deblurred fat image 'F' shown in step 50.

More specifically, a frequency map is generated by determining for each pixel in the image the voxel, or local, off-resonance frequency associated with that voxel. Local off-resonance frequencies are determined by finding $2\phi$, which is obtained as follows:

$$2\phi = \text{Arg}(S_2/S_0). \quad [5]$$

Even though signals blur into their vicinities due to the local off-resonance effects in the spiral image, from the assumption (i), the process 30 considers that $2\phi$ in Eq. [5] at each pixel gives the phase shift due to the true local $B_0$ inhomogeneity off-resonance frequency f. Phase unwrapping may then be performed to obtain the correct $\phi$ at each pixel using any suitable technique, such as the region growing method. f can then be successively determined from Eq. [4]. This process can proceed as desired to generate a map of frequencies for each pixel of interest.

At steps 40 and 48, water-fat signal decomposition is performed at each pixel based on the determined frequency map. From Eqs. [1–3], we obtain:

$$W' = ((S_0 + S_2 \exp(-i2\phi))/2 + S_1 \exp(-i\phi))/2, \quad [6]$$

$$F' = ((S_0 + S_2 \exp(-i2\phi))/2 - S_1 \exp(-i\phi))/2. \quad [7]$$

Since blurring artifacts still remain in the images W' and F', deblurring is to be performed on these images. In these steps 42 and 50, the process 30 employs a suitable deblurring process to create the deblurred image. In one practice, the process 30 uses a frequency-segmented off-resonance correction method. This method reconstructs several images using different demodulation frequencies and selects the most deblurred region from these reconstructed images under the guidance of a frequency map. As shown in FIG. 2, the demodulation frequencies used to deblur the image W' are the same frequencies as indicated in the frequency map. On the other hand, the demodulation frequencies used to deblur the image F' are the sum of the chemical-shift off-resonance frequency and local frequencies that are indicated in the frequency map. As such, the use of multiple demodulation frequencies enables reconstruction of the deblurred water and fat images W and F, respectively.

Although the spiral 3PD technique can achieve water-fat separation with off-resonance deblurring, the scan time is prolonged, since, as shown in FIG. 1, three data sets are acquired. To address this, a 2PD technique for spiral trajectories is described below.

Figure 3:
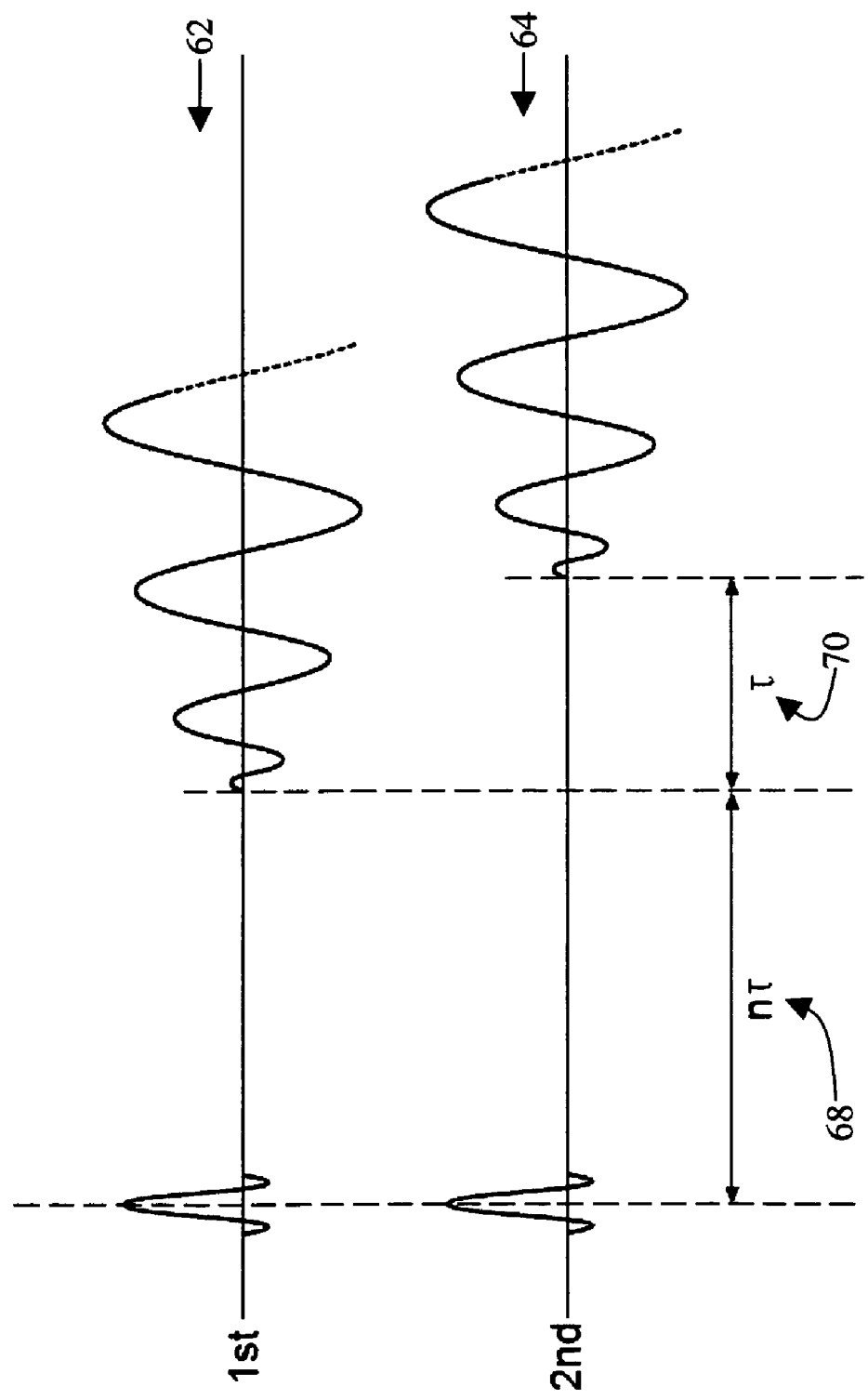
FIG. 3 is a simplified sequence diagram of the spiral two-point Dixon (spiral 2PD) technique.

In the spiral 2PD technique, as shown in FIG. 3, the TE's 70 of the first 62 and second 64 data acquisitions are $n\tau$ and $(n+1)\tau$, respectively, where n is a positive integer and $\tau$ is defined as in the spiral 3PD technique. This time delay allows for collecting data sets that have a known, and computationally favorable, phase relationship between water and fat.

The signals at each pixel in the reconstructed images ($S_0$ and $S_1$) from these data sets can be expressed as:

$$S_0 = W' + F', \qquad [8]$$

$$S_1 = (W' - F') \exp(i\varphi), \qquad [9]$$

where the definitions of W' and F' are the same as in the spiral 3PD technique, and $\varphi$ is the phase shift due to $B_0$ inhomogeneity off-resonance frequency f (Hz) during $\tau$ (s). That is, $$\varphi = 2\pi f \tau. \qquad [10]$$

For this process, it can be assumed that an RF pulse penetration angle into the transverse plane is substantially the same for both water and fat spins in each voxel. Water, and fat magnetization vectors in the transverse plane should be aligned with each other at the onset of the spiral gradient when TE is an even-integer multiple of $\tau$, and they are in the opposed phase when TE is an odd-integer multiple of $\tau$. In other words, if W' and F' are deblurred by k-space data demodulation with the correct local off-resonance frequencies (the water and fat images obtained this way are defined as W and F, respectively), the orientation of the two vectors W and F will be identical when TE is an even-integer multiple of $\tau$, and they will be opposite when TE is an odd-integer multiple of $\tau$.

Figure 4:
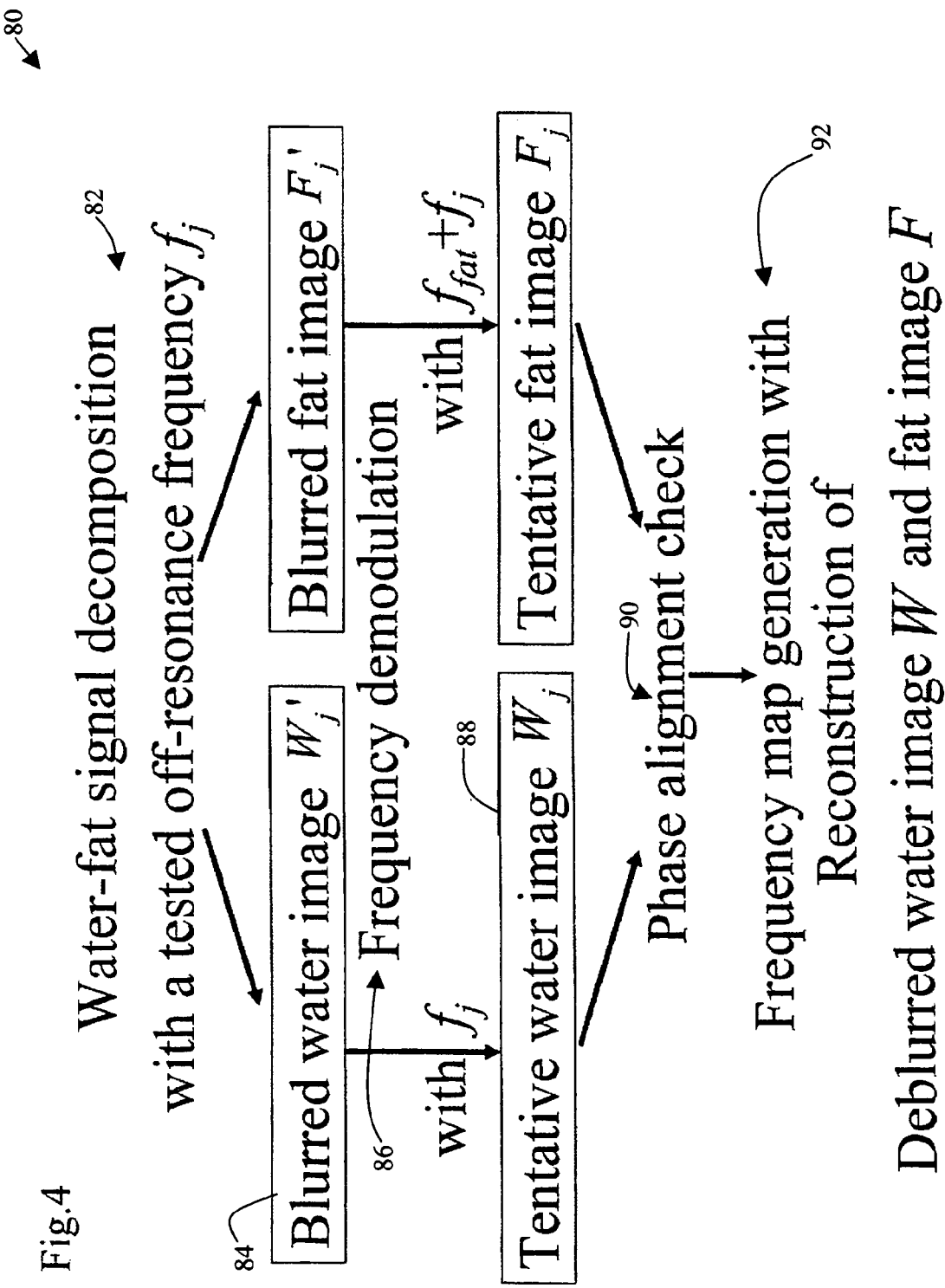
FIG. 4 is a flow chart of a spiral 2PD process.

FIG. 4 shows a flow chart of the spiral 2PD technique. For water-fat signal decomposition, several predetermined demodulation frequencies $f_j$ (Hz) are substituted into Eqs. [8,9]. W' and F' are solved for each demodulation frequency $f_j$ (defined as $W_j'$ and $F_j'$, respectively.):

$$W_j' = \frac{S_0 \exp(i\phi_j) + S_1}{2 \exp(i\phi_j)}, \qquad [11]$$

$$F_j' = \frac{S_0 \exp(i\phi_j) - S_1}{2 \exp(i\phi_j)}, \text{ where } \phi_j = 2\pi f_j \cdot \tau. \qquad [12]$$

The deblurred water and fat images $W_j$ and $F_j$ can be obtained after k-space data demodulation with the demodulation frequencies $f_j$ and $f_j + f_{fat}$ for $W_j'$ and $F_j'$, respectively. To determine the correct $B_0$ inhomogeneity off-resonance frequency at each pixel, the orientations of two vectors $W_j$ and $F_j$ are compared. When n is even (odd), the value of $f_j$ that makes the two vectors $W_j$ and $F_j$ aligned (opposed) to each other is selected as the correct local off-resonance frequency (the correct frequency is defined as $f_l$). As is evident, this process of local off-resonance frequency determination simultaneously reconstructs the final deblurred water and fat images, W and F.

In practice, since some voxels contain predominantly either only water or fat spins, the vector alignment property described above is difficult to use. To address this, the following quantity may be measured:

$$\Phi_j = 2 \cdot \text{Arg}\left(\frac{W_j + F_j}{W_j - F_j}\right). \qquad [13]$$

The absolute value of the principal value of this quantity is minimized when the two vectors $W_j$ and $F_j$ are aligned/opposed or when either $W_j$ or $F_j$ predominantly exists.

In certain application, it may be difficult to determine the correct frequency in image regions with low signal-to-noise ratio (SNR). Therefore, in one practice, the summation of $\exp(i\phi_j)$ within a small window centered on a pixel is measured and the real part of this quantity is extracted:

$$P_{local} = \text{Re}\left(\sum_{window} \exp(i\Phi_j)\right). \qquad [14]$$

The summation in Eq. [14] is a complex sum. $P_{local}$ is understood to be maximized when j=l. However, since $\Phi_j$ may show periodic-like patterns with j, even in the sufficiently high SNR regions, a plot of $P_{local}$–$f_j$ often has more than one peak with their magnitudes close to one another. As such, all the values of $f_j$ at which $P_{local}$ takes local maxima in the $P_{local}$–$f_j$ plot may first be chosen at every pixel of interest (these $f_j$ are defined as $f_p$). Then a phase unwrapping process, such as the region growing algorithm, may be performed to select the correct frequency $f_l$. Thus, of all the values of $f_p$, the one selected is typically that which is the closest to the average local frequency of the neighboring pixels in the frequency-determined region.

In certain practices multi-element surface coils are employed to obtain images with higher SNR than would be achieved with a single larger coil. Each surface coil usually has a small region of signal sensitivity. Thus the image reconstructed from each set of individual coil data, shows non-uniform signal intensity over field of view (FOV). The $B_0$ inhomogeneity frequency map derived from an individual coil may not be accurate for the region where the image SNR is low. The spiral 3PD and 2PD processes described above may be employed when data are acquired from multi-element surface coils.

For the spiral 3PD technique, $\exp(i2\phi)$ is determined from each coil data by Eq.[5]:

$$\exp(i2\phi_m) = \frac{S_{2,m}/S_{0,m}}{|S_{2,m}/S_{0,m}|}, \qquad [15]$$

where the subscript m represents the m-th coil data. The weighted sum of $\exp(i2\phi_m)$ with their signal intensity $|S_{0,m}|$ is taken at each pixel. It is understood that the argument of this value accurately represents twice the phase shift due to $B_0$ inhomogeneity off-resonance frequency during $\Delta TE$, that is, $$2\phi = \text{Arg}\left(\sum_{m=1}^{n} |S_{0,m}| \cdot \exp(i2\phi_m)\right), \qquad [16]$$

where n is the total number of coils. The frequency field map can be determined by the phase unwrapping algorithm as described in the previous subsection of the spiral 3PD technique. Signal decomposition and frequency demodulation are performed for each coil data based on the obtained frequency map.

For the spiral 2PD technique, at each demodulation frequency $f_j$, the quantity expressed as Eq. [13] is calculated for each coil data. They are combined at each pixel, weighted by the signal intensities of the reconstructed images, and $\Phi_j$ is redefined as:

$$\Phi_j = \text{Arg}\left(\sum_{m=1}^{n}(|W_{j,m}|+|F_{j,m}|)\cdot \exp\left(i\cdot 2\text{Arg}\left(\frac{W_{j,m}+F_{j,m}}{W_{j,m}-F_{j,m}}\right)\right)\right), \quad [17]$$

where n is the total number of coils, $W_{j,m}$ and $F_{j,m}$ are the water and fat images reconstructed from the m-th coil data with the predetermined demodulation frequency $f_j$. $P_{local}$ is computed from $\Phi_j$ defined in Eq. [17] using the algorithm as explained above in the discussion of the spiral 2PD technique. The method to determine the frequency field map from the newly defined $P_{local}$ is also the same.

In an optional practice, variable-density spiral imaging trajectories are provided to acquire the data sets in one acquisition. An efficient spiral off-resonance correction method with only one acquisition was proposed and is called 'off-resonance correction using variable density spirals (ORC-VDS).' In this method, odd- and even-numbered spiral interleaves have slightly different TE's, and the central portion of k-space is oversampled using variable-density spiral trajectories. A $B_0$ inhomogeneity field map can be calculated by taking the phase difference between the two low-resolution images reconstructed from the data of odd- and even-numbered spiral interleaves.

Figure 5A:
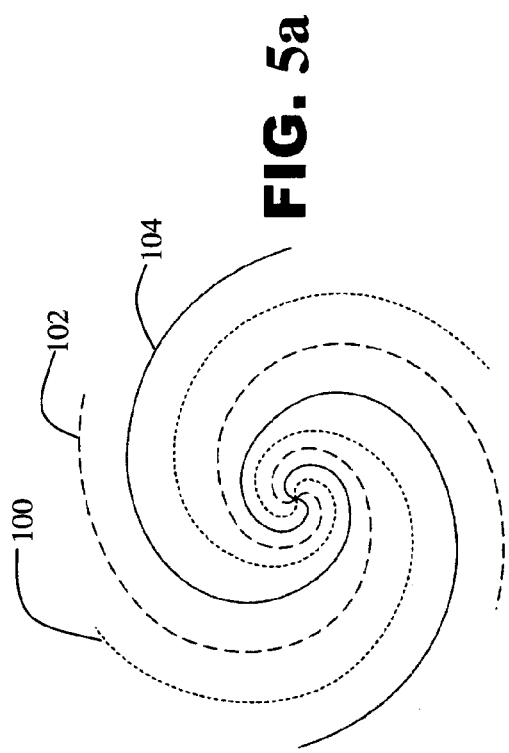
FIG. 5a–5b depict a variable density spiral (VDS) trajectory for Dixon techniques with one acquisition.
Figure 5B:
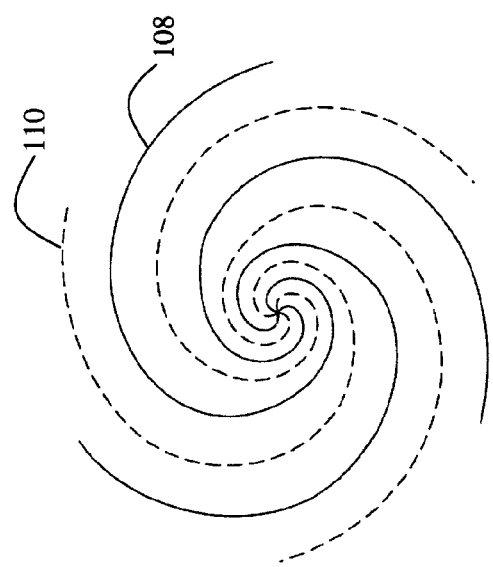

The extensions of this method to the spiral 3PD and 2PD processes follows from the above description. FIGS. 5a and 5b show spiral trajectories that oversample the inner regions of k-space with three times (a) and twice (b) higher sampling densities than the outer parts. In FIG. 5a, the solid 104, dashed 102, and dotted 100 spiral trajectories have three different TE's with their TE differences equal to τ. In FIG. 5b, the solid 108 and dashed 110 spiral trajectories have different TE's with their TE's equal to n τ and (n+1)τ, respectively. In both cases, off-resonance frequency field maps can be derived from the low spatial frequency data using the same algorithms as the spiral 3PD and 2PD techniques described above. It is understood that these spiral acquisition schemes enable one to perform the algorithms of spiral 3PD and 2PD techniques with only one acquisition. The Dixon techniques taking advantage of the sampling schemes shown in FIGS. 5a and 5b will be referred to as 'variable-density spiral 3PD (VDS-3PD) technique' and 'variable-density spiral 2PD (VDS-2PD) technique' from this point on. A description of the reconstruction algorithms of VDS-3PD/2PD techniques follows.

In both the VDS-3PD and VDS-2PD techniques, a frequency field map is derived from the low spatial frequency data using the spiral 3PD and 2PD algorithms, respectively. Water-fat decomposition and k-space data demodulation are performed for the low spatial frequency data, based on the frequencies indicated in the frequency field map. High spatial frequency data are also demodulated with the demodulation frequency indicated in the frequency field map, and are added to the demodulated low spatial frequency data.

In the VDS-3PD technique, the high-frequency data of three different TE's (defined as $Sh_0$, $Sh_1$, and $Sh_2$) are combined so that their phases are consistent with one another. In other words, when the demodulation frequency is $f_l$ (Hz), the high spatial frequency data of the three TE's to be added to the water image, are combined as (it is defined as Shw):

$$Shw = Sh_0 + Sh_1 \exp(-i2\pi f_l \tau) + Sh_2 \exp(-i2\pi f_l \cdot 2\tau), \quad [18]$$

and those that will be added to the fat image are combined as (it is defined as Shf):

$$Shf = Sh_0 + Sh_1 \exp(-i2\pi(f_l + f_{fat})\tau) + Sh_2 \exp(-i2\pi(f_l + \quad [19]$$
$$f_{fat})\cdot 2\tau)$$
$$= Sh_0 - Sh_1 \exp(-i2\pi f_l \tau) + Sh_2 \exp(-i2\pi f_l \cdot 2\tau).$$

Similarly, in the VDS-2PD technique, the high frequency data of two TE's ($Sh_0$ and $Sh_1$) to be added to the water image are combined as:

$$Shw = Sh_0 + Sh_1 \exp(-i2\pi f_l \tau), \quad [20]$$

and those to be added to the fat image are combined as:

$$Shf = Sh_0 - Sh_1 \exp(-i2\pi f_l \tau). \quad [21]$$

In both VDS-3PD/2PD techniques, Shw and Shf are demodulated with the demodulation frequencies $f_l$ and $f_l+f_{fat}$, respectively. These demodulated high frequency data are added to the low-frequency water and fat images that are already demodulated by the same frequencies $f_l$ and $f_l+f_{fat}$, respectively.

Both the spiral 3PD and 2PD techniques were implemented for in-vivo imaging experiments. All experiments were performed using a 1.5-Tesla Siemens Sonata scanner (Siemens Medical Solutions, Erlangen, Germany). In these experiments, axial brain and pelvis images were acquired from a healthy volunteer using a quadrature head coil and four-element phased-array surface coils, respectively. All procedures were done under an institutional review board-approved protocol for volunteer scanning.

The following sequence parameters were the same for all the spiral sequences used in the experiments: for the brain image experiments, there were 20 spiral interleaves, FOV 240×240 mm, slice thickness 10 mm, flip angle 13°, spiral readout time 16 ms, and TR 25 ms. For the pelvis imaging experiments, there were 20 spiral interleaves, FOV 390×390 mm slice thickness 10 mm, flip angle 13°, spiral readout time 15 ms, and TR 25 ms.

For the spiral 3PD technique, TE's were set to 2.2 (1st)/4.4 (2nd)/6.6 ms (3rd) in both the brain and pelvis imaging experiments. For the spiral 2PD technique, TE's were set to 2.2 ms (1st)/4.4 ms (2nd) in both the brain and pelvis imaging experiments.

The normal spiral sequences with SPSP pulses were also implemented for comparison. For excitation, 1-4-6-4-1 binomial pulses were used. The total flip angle for on-resonance spins was 16°. Two acquisitions were performed for off-resonance correction. TR was 33 ms and TE's were set to 6.0/7.5 (ms) in both the brain and pelvis imaging experiments.

The VDS-3PD technique was implemented for the axial pelvis image. The image was scanned from the same volunteer using four-element surface coils. The sequence parameters were: 18 interleaved spirals, TE 2.2/4.4/6.6 ms (each TE was shared by 6 interleaves), TR 25 ms, flip angle 13°, FOV 390 mm×390 mm, slice thickness 10 mm, and the radius of the over-sampled region was 40% of $k_{max}$.

For reconstruction of the brain images, k-space data were gridded onto a Cartesian grid. The modified Block Uniform Resampling (BURS) algorithm was used for k-space gridding. For reconstruction of the pelvis images, the next-neighbor re-gridding was used to facilitate reconstruction of the multiple k-space data sets. For both water and fat images, the image reconstructed from each coil data was combined using the sum-of-squares method.

In the spiral 2PD technique, the predetermined demodulation frequencies are ranged from −200 Hz to +200 Hz with the frequency resolution 10 Hz (i.e., 41 demodulation frequencies in total) in both brain and pelvis image reconstructions. The window sizes to compute $P_{local}$ were set to 9×9 pixels and 5×5 pixels for the brain and pelvis image reconstructions, respectively.

EXAMPLES

Figure 6B:
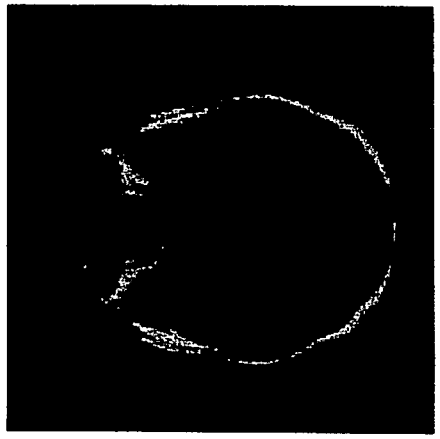
FIGS. 6a–6f depict the axial brain images.
Figure 6D:
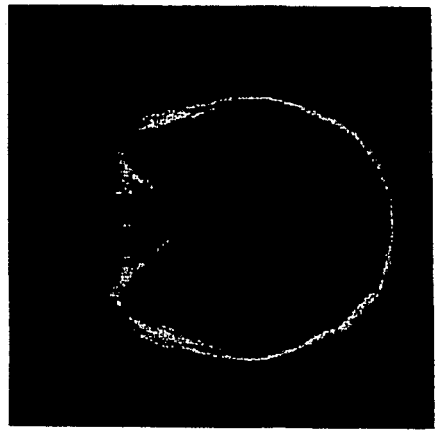
Figure 6A:
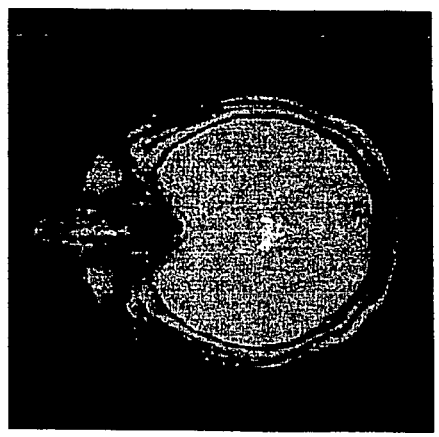
Figure 6C:
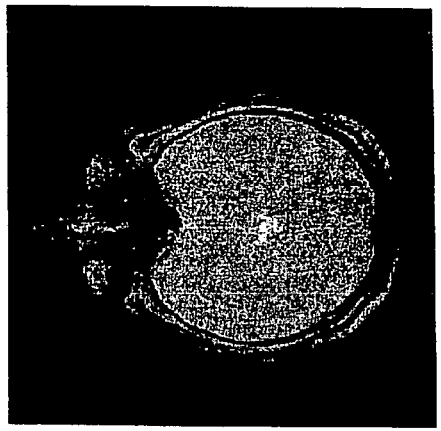
Figure 6F:
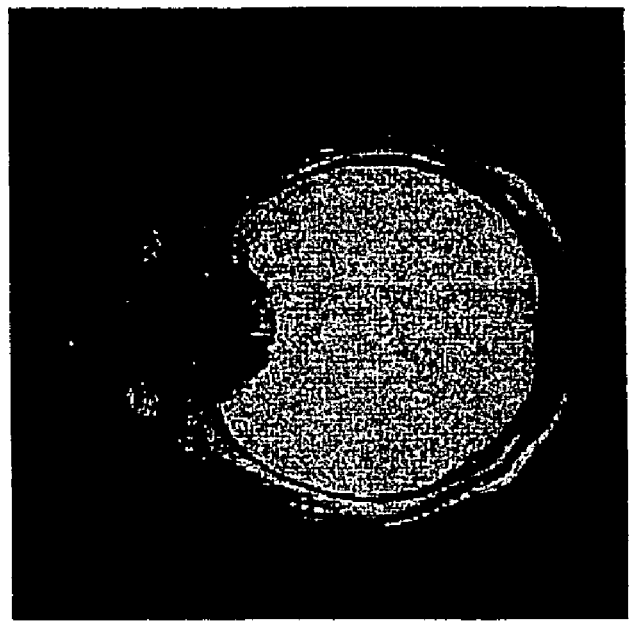
Figure 6E:
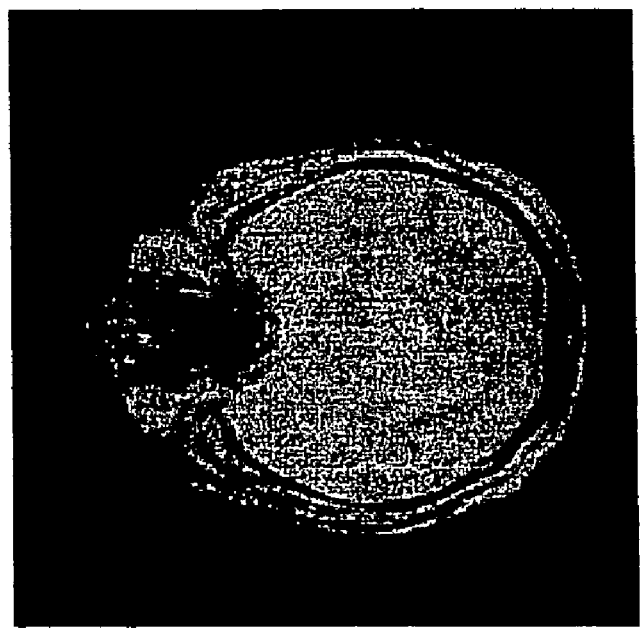

FIGS. 6a–6f show the axial brain images. FIG. 6a and FIG. 6b are the water and fat images using the spiral 3PD technique, respectively. FIG. 6c and FIG. 6d are the water and fat images using the spiral 2PD technique, respectively. FIG. 6e is one of the images directly reconstructed from the acquired data (TE 4.4 ms). FIG. 6f is one of the images reconstructed from the data with SPSP pulses (TE 7.5 ms) after off-resonance correction. FIG. 7a–7f show the axial pelvis images. FIGS. 7a–7f, were acquired under the same conditions as those in corresponding locations in FIGS. 6a–6f.

Figure 7A:
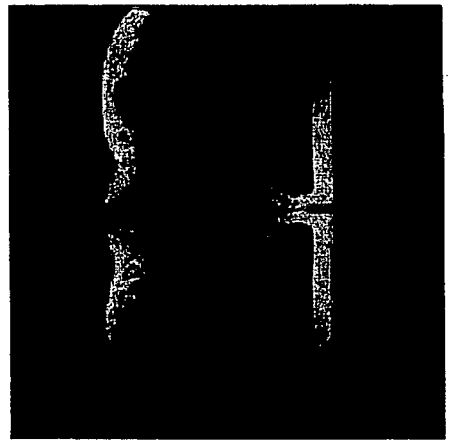
FIGS. 7a–7f depict the axial pelvis images.
Figure 7B:
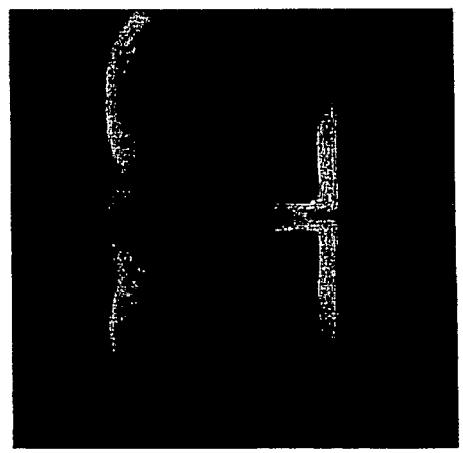
Figure 7C:
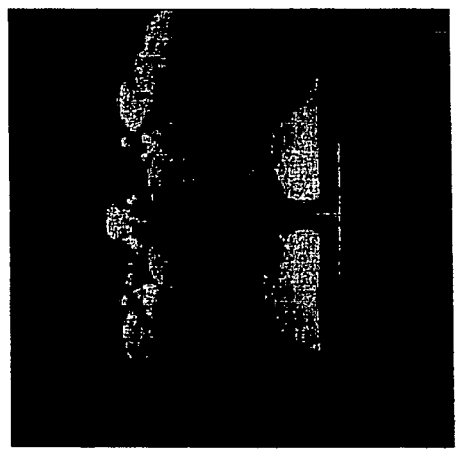
Figure 7D:
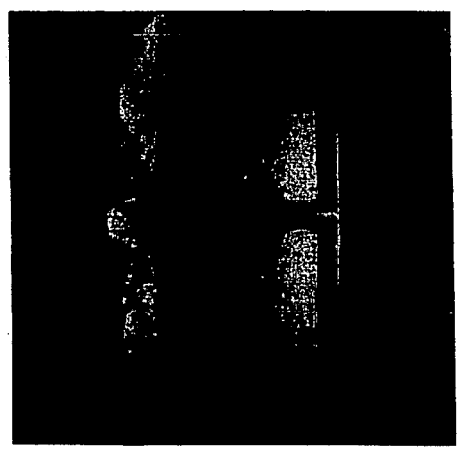
Figure 7F:
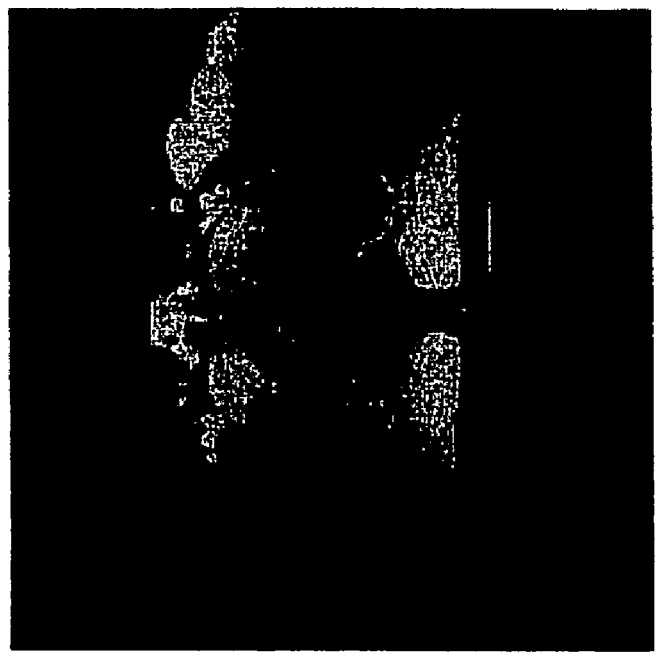
Figure 7E:
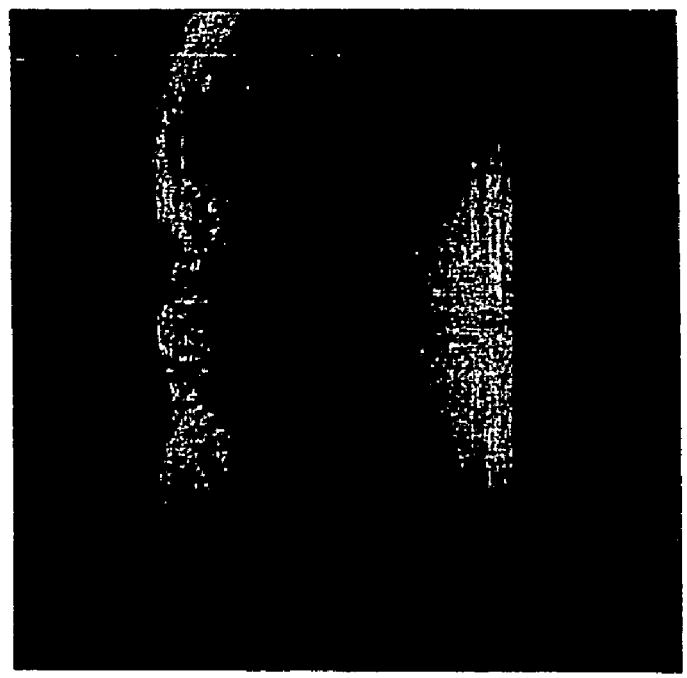

As observed in FIG. 6e and FIG. 7e, the original images are affected by the high level of blurring artifacts for most of the imaged regions. However as both FIGS. 6a–6d and FIGS. 7a–7d show, these blurring artifacts are substantially reduced while unambiguous water-fat decomposition is achieved in both the spiral 3PD and 2PD techniques. FIG. 7f (SPSP pulses) shows that some fat signals in the right anterior subcutaneous region are not sufficiently suppressed.

Figure 8B:
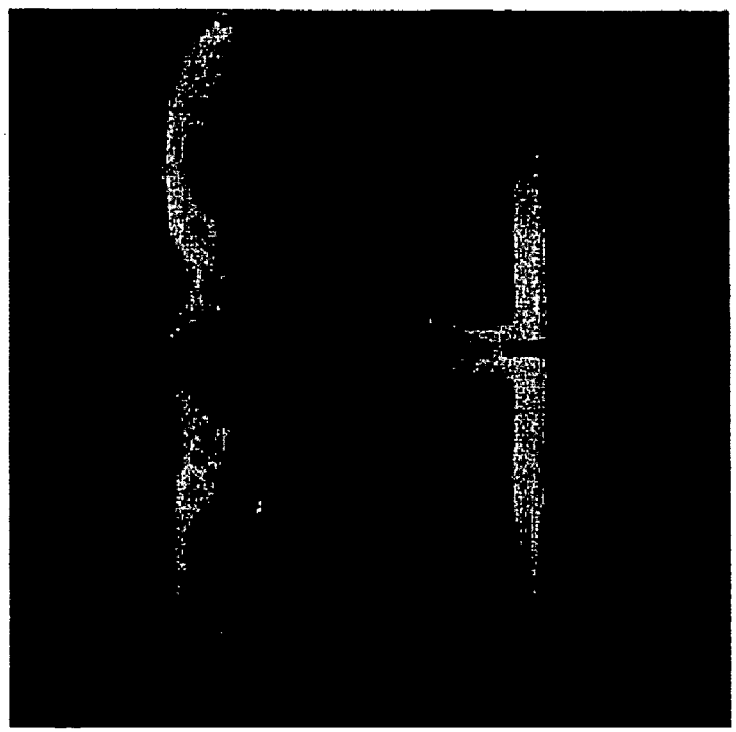
FIGS. 8a–8b depict the axial pelvis images using the VDS-3PD process.
Figure 8A:
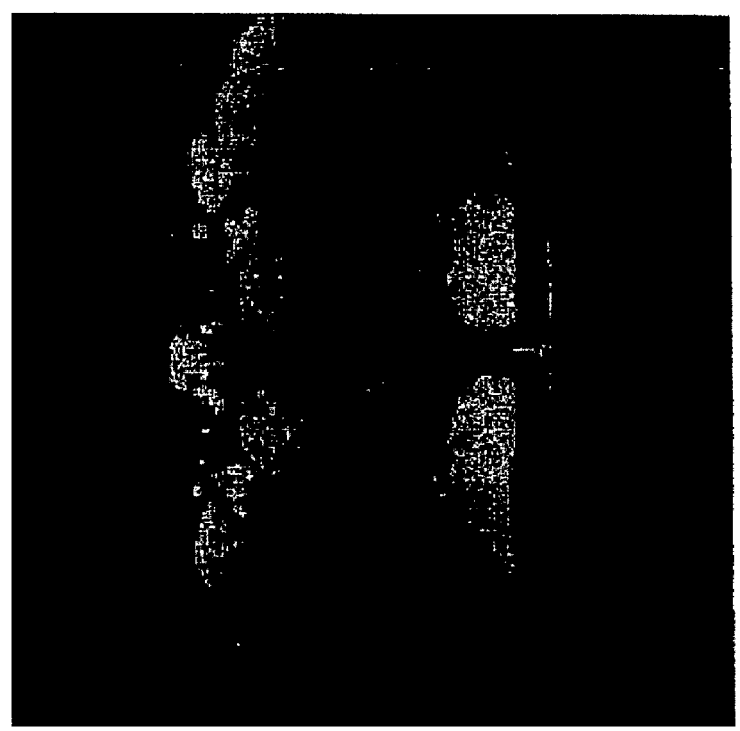

The results of the VDS-3PD technique are shown in FIG. 8a the water image, and FIG. 8b the fat image). As seen in FIGS. 8a–8b, the water and fat signals are successfully decomposed, and no significant blurring artifacts remain.

As shown, both spiral 3PD and 2PD techniques successfully perform off-resonance blurring correction with water-fat signal decomposition. One of the main advantages of the Dixon technique is that uniform fat suppression can be achieved across an FOV in the presence of $B_0$ inhomogeneity. The frequency maps of the pelvis image (not shown) indicate that local $B_0$ off-resonance frequencies at the right anterior subcutaneous region are quite large (+150 Hz~+180 Hz) compared with other parts due to air-tissue interface susceptibility. Thus, the fat signals in this region remain with SPSP pulses as seen in FIG. 7f while the spiral 3PD and 2PD techniques lead to unequivocal water-fat signal decomposition at the corresponding region, as observed in FIGS. 7a–7d. Similarly, as FIG. 6f shows, wide anterior regions of the left temporal lobe of the brain appear slightly darker (lower homogeneity) than in other parts of the brain. This observation cannot be made in FIG. 6a and FIG. 6c. The frequency field maps of the brain image (not shown) indicate that the off-resonance frequencies in the dark regions of the left temporal lobes are relatively larger (−90 Hz~−60 Hz) than in other parts of the brain. Since SPSP pulses are frequency-sensitive fat suppression techniques, it can be presumed that water signals in these regions are partly suppressed. As a consequence, these regions appear darker as seen in FIG. 6f. As these examples illustrate, both the spiral 3PD and 2PD techniques lead not only to uniform fat suppression but they avoid unwanted water signal suppression when $B_0$ inhomogeneity exists.

Non-uniform fat signal suppression and undesirable water signal suppression could be reduced by the use of SPSP pulses with a sharper transition band between the water and fat frequencies. However, off-resonance frequencies induced by local susceptibility are sometimes as large as or even larger than the chemical-shift off-resonance frequency. In such cases, it is impossible to eliminate the above artifacts no matter how improved SPSP pulses are used.

As the spiral 2PD technique achieves almost the same performance as the spiral 3PD technique, it is suggested that the spiral 2PD technique be used if a shorter total acquisition time is required. However, as is evident, the algorithm of the spiral 3PD technique is computationally more efficient than that of the spiral 2PD technique. In the spiral 3PD technique, a frequency field map can be directly computed from Eq.[5] (with an additional phase unwrapping procedure) and then water-fat signal decomposition and frequency demodulation can be performed based on the obtained frequency map, as shown in FIG. 2. In the spiral 2PD technique, however, a number of predetermined frequencies need to be tested in order to determine the frequency field map. As the off-resonance frequency range of scanned objects is usually unknown when scanning is performed, the range of predetermined frequencies must be set sufficiently large to cover all of the off-resonance frequencies. In the image reconstruction example above, 41 predetermined frequencies that covered 400 Hz we used. The off-resonance frequency ranges that appeared in the computed frequency maps were 300 Hz for the brain image and 240 Hz for the pelvis image (these frequency maps are not shown.). In other words, 10 and 16 extra frequencies were tested in each image reconstruction, although they were actually unnecessary. However, under the condition that actual off-resonance frequency range is unknown, it is difficult to avoid these extra computations.

While all the images shown in FIGS. 6–8 were reconstructed using MATLAB (The MathWorks, Natick, Mass.), C++ reconstruction codes were also developed in version A1.4 of the ICE software environment found on the scanner's host computer. The computation times of spiral 3PD technique were approximately 10 (s) and ~23 (s) when single coil and four coils were used for the data acquisition, respectively. Those of the spiral 2PD technique were approximately 80 (s) and 132 (s) when single coil and four coils were used, respectively.

The spiral 2PD technique typically benefits from the determination of the window sizes to calculate $P_{local}$. In the previously proposed two-point Dixon technique in the rectilinear sampling schemes, off-resonance frequencies were evaluated at each pixel. However, pixelwise frequency evaluation is difficult in low SNR regions and at tissue-lipid boundaries. To reduce the errors due to noise in evaluating off-resonance frequencies, we set a small window at each pixel, considering that the frequency within the window is almost constant under assumption (i). This method is useful to reduce noise effects. However, in practice it is difficult to determine appropriate window sizes. If the window size is small, observable errors due to noise may still exist in the computed frequency field map. If the window size is large, even though noise effects can be reduced, abrupt changes of local off-resonance frequencies may be difficult to detect. In the performed image reconstruction, relatively large windows (9×9 pixels) were used for the brain image as frequency evaluation at the boundaries between the postocular fat regions and their neighboring tissues was unstable when a smaller-sized window was used. Since the results of the spiral 2PD technique are comparable to those of the spiral 3PD technique, it is considered that the frequency map derived for the brain image in the spiral 2PD technique is as accurate as the frequency map derived in the spiral 3PD technique. In other words, a 9×9 window size is small enough to create an accurate frequency map for the spiral 2PD technique in practice. This result can be understood from the fact that a $B_0$ off-resonance frequency map is often derived from the low-resolution images in the conventional spiral acquisition method. This concept was also taken advantage of in our VDS-Dixon techniques.

In the conventional spiral acquisition method with SPSP pulses, two data sets with different TE's often need to be acquired to correct for off-resonance blurring artifacts. The necessity of two data sets diminishes the advantage of spiral imaging as a fast acquisition method. When non-negligible motion is involved between the first scan and the subsequent scan, the off-resonance correction algorithm may fail in spiral imaging because of motion-dependent misregistration between the two images. Similarly, accurate water-fat decomposition may be difficult to achieve in the Dixon technique if there is motion-dependent misregistration among the reconstructed images with different TE's. VDS-3PD/2PD techniques have overcome these drawbacks.

As is evident in the algorithms of VDS-3PD/2PD techniques described above, since high-frequency data can not be separated into water and fat signals, when the combined high-frequency data of water Shw (Eqs.[18, 20]) are added to the low resolution water image, fat signals in the high frequency data are also added to the low resolution water image. However, as evident from the difference between Eqs. [18 and 19] and the difference between Eqs. [20 and 21], the phases of fat signals in the high frequency data of different TE's are not consistent with one another when water signals in the high frequency data are phase-consistent. Moreover, when the water image is reconstructed, the fat signals in the high frequency data are demodulated not by their demodulation frequency $f_l+f_{fat}$ but by the demodulation frequency of water signals $f_l$. Therefore, the high-frequency components of the fat signals are smeared out in the water image. As the total signal amounts of the high frequency components are usually quite small compared with those of the low frequency components, it is considered that the artifacts due to high frequency components of the fat signals are usually not significant in the water image. Similarly, since water signals in the high-frequency data are spread out in the fat image, there are usually no considerable artifacts in the fat image caused by the high spatial frequency water signals.

As seen in FIGS. 8a–8b, water-fat signal decomposition and off-resonance blurring correction are successfully achieved in the VDS-3PD technique. However, the quality of the images in FIGS. 8a–8b is degraded when compared with those of the spiral 3PD technique FIG. 7a and FIG. 7b. One of the main reasons for this is that the image SNR's in FIGS. 8a–8b are lower than those in FIG. 7a and FIG. 7b, because the images in FIGS. 8a–8b were constructed from reduced data compared with FIG. 7a and FIG. 7b. Another reason is that, as mentioned above, the fine structures in the water image FIG. 8a (the fat image FIG. 8b are obscured by the 'spread-out' fat signals (water signals) contained in the high-frequency data. This problem is present with the VDS-3PD/2PD techniques unless the oversampled k-space region is expanded. As this example suggests, although the VDS-3PD/2PD techniques provide scan time advantages, they may not be suitable when fine structures are of particular interest (e.g., coronary angiography). In such a case, the spiral 3PD/2PD techniques would be recommended.

Figure 9:
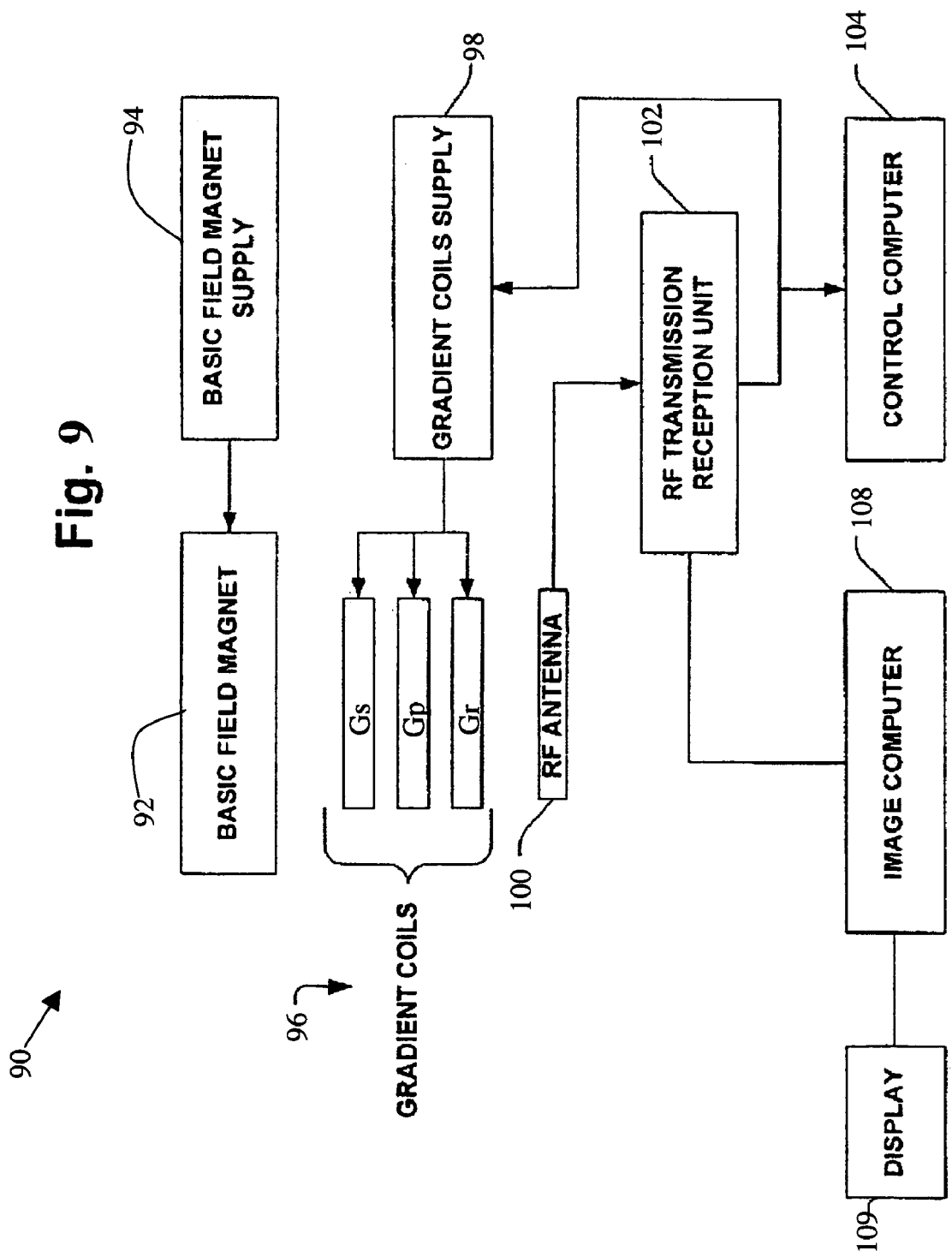
FIG. 9 illustrates an exemplary magnetic resonance system that may be used with the systems and methods described herein.

FIG. 9 illustrates one example magnetic resonance system 90 of the type that can be used with the systems described above. Other MRI systems are known to those skilled in the art, and, along with other well-known systems, are not illustrated herein, for the sake of brevity. The system 90 includes a basic field magnet 92 supplied by a basic field magnet supply 94. The system has gradient coils 96 for respectively emitting gradient magnetic fields $G_s$, $G_p$ and $G_r$, operated by a gradient coils supply 98. An RF antenna 100 is provided for generating the RF pulses, and for receiving the resulting magnetic resonance signals from an object being imaged. The RF antenna 100 is operated by an RF transmission/reception unit 102. The RF antenna 100 may be employed for transmitting and receiving, or alternatively, separate coils can be employed for transmitting and receiving. The gradient coils supply 98 and the RF transmission/reception unit 102 are operated by a control computer 104 to produce radio frequency pulses that are directed to the object to be imaged. The magnetic resonance signals received from the RF antenna are subject to a transformation process, such as a two dimensional fast Fourier Transform (FFT), which generates pixelated image data. The transformation may be performed by an image computer 108 or other similar processing device. The image data may then be shown on a display 109. In one example, the MRI apparatus can acquire data, according to a planned sequence (e.g., Spider, rEPI, radial turbo SE).

Alternate Embodiments

The order in which the steps of the present method are performed is purely illustrative in nature. In fact, the steps can be performed in any order or in parallel, unless otherwise indicated by the present disclosure.

The method of the present invention may be performed in either hardware, software, or any combination thereof, as those terms are currently known in the art. In particular, the present method may be carried out by software, firmware, or microcode operating on a computer or computers of any type. Additionally, software embodying the present invention may comprise computer instructions in any form (e.g., source code, object code, interpreted code, etc.) stored in any computer-readable medium (e.g., ROM, RAM, magnetic media, punched tape or card, compact disc (CD) in any form, DVD, etc.). Furthermore, such software may also be in the form of a computer data signal embodied in a carrier wave, such as that found within the well-known Web pages transferred among devices connected to the Internet. Accordingly, the present invention is not limited to any particular platform, unless specifically stated otherwise in the present disclosure.

While particular embodiments of the present invention have been shown and described, it will be apparent to those skilled in the art that changes and modifications may be made without departing from this invention in its broader aspect and, therefore, the appended claims are to encompass within their scope all such changes and modifications as fall within the true spirit of this invention.

What is claimed is:

1. A method of chemical species suppression for MRI imaging of a scanned object region comprising:

acquiring K space data using a spiral acquisition technique with a first TE of 2.2 milliseconds, a second TE of 4.4 milliseconds, and a third TE of 6.6 milliseconds, for purposes of performing three-point Dixon processing, wherein each TB is a multiple of 2.2 milliseconds;

reconstructing three sets of image data having off resonance effects;

estimating the off resonance effects at locations throughout the three reconstructed sets of image data;

decomposing said three sets of reconstructed image data into water and fat image data sets each representing a separate chemical species; and correcting said water and fat image data sets for blurring resulting from off resonance effects due to local Bo inhomogeneity using said estimated off resonance effects, wherein each of the fat and water image data sets suppresses signals from other chemical species.

2. The method defined in claim 1 wherein the step of acquiring K space data at the first TB, the second TB, and the third TB comprises acquiring signal components from both the fat and water chemical species at each of the TB times.

3. The method defined in claim 1 wherein the step of estimating the off resonance effects comprises generating an estimated frequency field map.

4. The method defined in claim 1 wherein an off resonance correction method is used to eliminate the effects of local $B_0$ inhomogeneity on the water image data set.

5. The method defined in claim 1 wherein an off resonance correction method is used to eliminate the effects of local $B_0$ inhomogeneity on the fat image data set.

6. The method defined in claim 1 wherein said correcting said water and fat image data sets for blurring is accomplished by using an off resonance correction method on the blurred water and the blurred fat image data sets.

7. The method defined in claim 3 wherein the water and fat image data sets are corrected based on the frequencies indicated in the estimated frequency field map at each pixel location having blurring due to the off resonance effects of local $B_0$ inhomogeneity.

8. The method defined in claim 7 wherein said correcting comprises demodulating the water and fat image data sets with demodulation frequencies $f_1$ and $f_l+f_s$ to create locally deblurred image data sets of the water and fat chemical species respectively.

9. The method defined in claim 8 wherein said correcting comprises reconstructing the entirely deblurred water image data set by combining the deblurred regions of the water image data set from each local frequency, $f_l$, in the estimated frequency field map.

10. The method defined in claim 8 wherein said correcting comprises reconstructing the entirely deblurred fat image data set by combining the deblurred regions of the fat image data set from each local frequency, $f_s$, in the frequency field map.

11. The method defined in claim 1 further comprising acquiring a plurality of interleaves, wherein each interleave uses a different 2.2 millisecond TB multiple and the sampling density of each interleave is sufficient to create a low resolution image data set.

12. The method defined in claim 11 wherein the sampling density of each fat and water component sufficiently oversamples k space in order to create a low-resolution image data set of the object at the respective TE.

13. The method of claim 1 wherein said step of correcting is performed as an integral part of said decomposing step.

14. The method of claim 1 wherein said step of correcting is performed separately from said step of decomposing.

15. A method to separate fat and water signals in MRI imaging of a scanned object region, said method comprising:

acquiring three sets of K-space data via spiral scanning before image reconstruction, wherein said sets of K-space data are acquired using a TE of 2.2 milliseconds for the first set, 4.4 milliseconds for the second set, and 6.6 milliseconds for the third set, for purposes of performing three point Dixon processing, wherein each TE is a multiple of 2.2 milliseconds;

generating a frequency field map from said three sets of K-space data;

performing water-fat decomposition using said three sets of K-space data to reconstruct a blurred water image and a blurred fat image; and applying said frequency field map to said blurred water image and said blurred fat image to form a deblurred water image and a deblurred fat image.

* * * * *